(12) United States Patent
Verbruggen et al.

(10) Patent No.: US 8,384,578 B2
(45) Date of Patent: Feb. 26, 2013

(54) STOCHASTIC ANALOG-TO-DIGITAL (A/D) CONVERTER AND METHOD FOR USING THE SAME

(75) Inventors: Bob Verbruggen, Kessel-lo (BE); Jan Craninckx, Boutersem (BE)

(73) Assignee: IMEC, Leuven (BE)

( * ) Notice: Subject to any disclaimer, the term of this patent is extended or adjusted under 35 U.S.C. 154(b) by 76 days.

(21) Appl. No.: 13/192,056

(22) Filed: Jul. 27, 2011

(65) Prior Publication Data

US 2013/0015988 A1    Jan. 17, 2013

(30) Foreign Application Priority Data

Jul. 13, 2011 (EP) .................................... 11173743

(51) Int. Cl.
H03M 1/14 (2006.01)
H03M 1/04 (2006.01)

(52) U.S. Cl. ....................................... 341/156; 341/109

(58) Field of Classification Search .................. 341/109, 341/131, 156
See application file for complete search history.

(56) References Cited

U.S. PATENT DOCUMENTS

| | | | | |
|---|---|---|---|---|
| 4,745,393 | A * | 5/1988 | Tsukada et al. ............... | 341/156 |
| 7,605,738 | B2 * | 10/2009 | Kuramochi et al. .......... | 341/155 |
| 2012/0194375 | A1 * | 8/2012 | Vigoda et al. ................. | 341/155 |

OTHER PUBLICATIONS

Goren, D. et al. A Novel Method for Stochastic Nonlinearity Analysis of a CMOS Pipeline ADC, DAC 2001, Jun. 18-22, 2001. Las Vegas, Nevada, USA. Copyright 2001 ACM 1-581 13-297-2/01/0006.*

Giannini, Vito et al., "An 820uW 9b 40MS/s Noise-Tolerant Dynamic-SAR ADC in 90nm Digital CMOS", IEEE ISSCC Dig. Tech. Papers, Feb. 2008, pp. 238-239 and p. 610.
Ceballos, Jose Luis et al., "Stochastic Analog-to-Digital Conversion", 48th Midwest Symposium on Circuits and Systems, 2005, pp. 855-858.
Weaver, Skyler et al., "Stochastic Flash Analog-to-Digital Conversion", IEEE Transactions on Circuits and Systems-I: Regular Papers, vol. 57, No. 11, Nov. 2010, pp. 2825-2833.
European Search Report, European Patent Application No. 11173743.3 dated Dec. 29, 2011.

* cited by examiner

*Primary Examiner* — Howard Williams
(74) *Attorney, Agent, or Firm* — McDonnell Boehnen Hulbert & Berghoff LLP (57) ABSTRACT

An analog-to-digital (A/D) converter circuit arranged for receiving an analog input signal and for outputting a digital representation of said analog input signal is described. The A/D converter circuit includes:
  a first converter stage configured for receiving the analog input signal and for generating a first set of conversion bits, a first completion signal and a residual analog output signal representing the difference between the analog input signal and a signal represented by said first set of conversion bits,
  a second converter stage comprising
     a clock generation circuit arranged for receiving the first completion signal and for generating a clock signal,
     a plurality of comparators each being configured for receiving the residual analog output signal and a common reference voltage, said plurality of comparators arranged for being activated by the clock signal and for outputting a plurality of comparator decisions,
     a digital processing stage configured for receiving the plurality of comparator decisions and for generating a second set of conversion bits,
  means for generating the digital representation of the analog input signal by combining the first and second set of conversion bits.

10 Claims, 6 Drawing Sheets

STOCHASTIC ANALOG-TO-DIGITAL (A/D) CONVERTER AND METHOD FOR USING THE SAME

CROSS-REFERENCE TO RELATED APPLICATIONS

This application claims priority under 35 U.S.C. §119(b) to European Patent Application EP 11173743, filed on Jul. 13, 2011, the full disclosure of which is incorporated herein by reference.

TECHNICAL FIELD

The present disclosure generally relates to analog to digital (A/D) conversion and more specifically to the design of an analog to digital converter with high accuracy and low power consumption.

BACKGROUND

Analog-to-digital converters (ADCs) are an important part of many electronic systems. Their power consumption for a given resolution and speed has been improved significantly in recent years due to optimized architectures, novel circuit techniques and technology scaling.

OVERVIEW

A/D converters contain circuits called comparators that each convert an analog signal into a one bit digital signal. In most efficient ADC implementations these comparators are clocked and use regeneration to amplify small voltage differences to digital signal levels. A non-ideality they have to cope with when performing this task, is the comparator noise. Comparator noise is a well-known impairment which potentially degrades the performance of most conventional ADCs. Due to this noise the comparator may output a wrong decision, i.e. the comparator outputs a zero instead of a one or vice versa. In most ADC architectures these decision errors degrade the overall conversion result, thereby decreasing the signal-to-noise ratio (SNR) and hence the Effective Number of Bits (ENOB).

One solution to this problem is to simply decrease the probability that the comparator make a wrong decision. However, for a given comparator topology reducing the error probability inevitably results in increased power consumption, reduced bandwidth or reduced speed. This approach therefore degrades the other ADC performance metrics since an extra bit of resolution requires a factor 4 increase in comparator power.

An alternative approach is to use an ADC architecture that is more robust to comparator errors, such as pipeline. Another alternative, which is nowadays seen as the most efficient converter implementation, employs redundant SAR (Successive Approximation Registers) converters. These alternatives typically feedback the potentially erroneous comparator decision and keep track of the residue. This residue can then either be amplified until the input referred comparator noise is no longer critical (pipeline converters) or be quantized at a later time with more accurate comparators.

The effect of comparator noise on a conventional ADC can be described more in detail as follows. The core function of an N-bit conventional ADC is to determine in which of $2^N$ bins (digital values) defined by the N bits, the input voltage is located. This is done by comparing the input signal, either directly or indirectly, to a set of thresholds separating these bins. Simply put, the ADC has to find two adjacent thresholds such that the input is smaller than one and larger than the other. One way of performing this search is in parallel, as in a flash ADC, with the disadvantage that a large ($2^N-1$) number of comparisons is needed. By using a binary search, as in a SAR ADC, the number of comparisons can be reduced to just N. Many intermediate searching strategies are possible, but all of them share the need to compare the input signal or a signal derived thereof to a set of thresholds.

Due to comparator noise, any of these comparisons can be in error, with highest probability of error when the threshold is close to the input. For simplicity, it is for now assumed that the comparator always returns the correct output if the difference between the input and the threshold is larger than half a bin width. Since the ADC does not know beforehand which thresholds are close to the input, all comparisons are potentially in error due to comparator noise. However, for any input of the ADC at most one comparison is noise-critical, since all other comparisons compare the input to a threshold which is at least half a bin width away.

As already indicated, the conventional solution is to decrease the probability the comparator make a wrong decision, which however leads to the above-mentioned problems. As the increased power consumption in the comparator is not needed in any comparison but the noise-critical comparison, this is wasteful. Significant power savings would be possible if the ADC could somehow identify the critical comparison and use a lower-noise comparator when resolving it.

Unfortunately, it is not possible to conclusively identify the critical comparison based on other comparisons. Indeed, even with a full set of noiseless comparators, one can only detect that the input is between two of these comparisons. While it can be asserted that one of the two is critical, there is no information at all to indicate which of the two is the critical one: at best one can therefore identify two potentially critical comparisons.

The pair of potentially critical thresholds is identified at low power in the paper "*An 820 µW 9b 40 MS/s noise-tolerant dynamic-SAR ADC in 90 nm digital CMOS*" (V. Giannini et al., IEEE ISSCC Dig. Tech. Papers, February 2008, pp. 238-239) as part of a redundant SAR converter. Two low-noise comparisons are still required, however, as opposed to the theoretical minimum of one.

The concept of combining a number of noisy comparator decisions is proposed in "*Stochastic analog-to-digital conversion*" (Ceballos et al., 48$^{th}$ Midwest Symposium on Circuits and Systems, 2005). It is shown that the SNR of the quantizer (comparator) can be improved in this way. The proposed approach relies on explicitly added noise and not on the noise inherently present in the comparators.

Another related area is the work by S. Weaver et al. in "*Stochastic Flash Analog-to-Digital Conversion*" (IEEE Trans. Circuits and Systems I, pp. 2825-2833, Vol. 57, Issue 11, 2010). Here inherent comparator offset is used to replace flash converter references.

Hence, there is a need for a low power analog-to-digital converter circuit that deals with comparator noise while using only the power consumption of a single noise-critical comparison. An example objective of the present disclosure is to provide a high accuracy, low power analog-to-digital converter circuit where the above-mentioned problems are overcome.

The present disclosure relates to an analog-to-digital converter (ADC) circuit arranged for receiving an analog input signal and for outputting a digital representation of the analog input signal. The ADC circuit may comprise:

a first converter stage configured for receiving the analog input signal and for generating a first set of conversion bits, a first completion signal and a residual analog output signal representing the difference between the analog input signal and a signal represented by the first set of conversion bits, a second converter stage comprising
  a clock generation circuit arranged for receiving the first completion signal and for generating a clock signal,
  a plurality of comparators each being configured for receiving the residual analog output signal and a common reference voltage, said plurality of comparators arranged for being activated by the clock signal and for outputting a plurality of comparator decisions,
  a digital processing stage configured for receiving the plurality of comparator decisions and for generating a second set of conversion bits, and means for generating the digital representation of the analog input signal by combining the first set of conversion bits and the second set of conversion bits.

The proposed circuit overcomes the problems of the prior art solutions. In the above example, in the first converter stage a digital representation of a certain bit length of the analog input signal is determined along with a residue signal representing the error made in this first stage. Then, in a second stage, a stochastic conversion is performed on the residue signal. A completion signal is generated when the operations in the first converter stage are terminated. This completion signal is fed to the second stage, more in particular to the clock generation circuit provided in that second stage. Reception of the completion signal initiates the operation of the second converter stage. The clock generation circuit generates a clock signal that activates the various comparators in the second stage. Each comparator receives the residual analog output signal and a common reference voltage to compare and a comparator decision is output. In the digital processing stage the comparator decisions are processed and a second set of conversion bits is produced. Due to the plurality of comparators and the decisions they produce, not only the sign but also the magnitude of the input signal, can be estimated. The digital representation of the applied analog input signal is then obtained by combining the first and second set of conversion bits.

In an example embodiment the second stage further comprises a counter that counts clock pulses and, when the number of clock pulses reaches a given value, generates a second completion signal for controlling the number of times the clock signal is generated.

In another example, the A/D converter circuit of the disclosure may further comprise a digital-to-analog converter circuit for generating the signal represented by the first set of conversion bits.

In yet another example embodiment, the A/D converter circuit further comprises subtraction means for generating the residual analog output signal.

The digital processing stage comprised in the second converter stage may be arranged for determining an average value of the plurality of comparator decisions and for determining an input signal level corresponding to the average value.

In an example embodiment, the first converter stage is implemented as a successive approximation register analog-to-digital converter. Alternatively, the first converter stage may be implemented as a pipeline analog-to-digital converter comprising a plurality of pipelined stages, whereby said residual analog output signal is the residue signal of the last pipelined stage.

In another aspect, the disclosure relates to a method for converting an analog input signal into a digital representation of the analog input signal. The method may comprise the steps of:
  performing a first conversion of the analog input signal, thereby generating a first set of conversion bits and a residual analog output signal representing the difference between the analog input signal and a signal represented by the first set of conversion bits,
  when a first completion signal is generated, applying the residual analog output signal and a common reference voltage signal to a plurality of comparators, said plurality of comparators being activated by a clock signal, and outputting a plurality of comparator decisions,
  processing the plurality of comparator decisions, thereby generating a second set of conversion bits,
  generating the digital representation of the analog input signal by combining the first and the second set of conversion bits.

In an example embodiment a calibration step is performed for determining an indication of the comparator noise of the plurality of comparators.

These as well as other aspects, advantages, and alternatives, will become apparent to those of ordinary skill in the art by reading the following detailed description, with reference where appropriate to the accompanying drawings.

BRIEF DESCRIPTION OF THE DRAWINGS

Various exemplary embodiments are described herein with reference to the following drawings, wherein like numerals denote like entities. The drawings described are schematic and are non-limiting.

DETAILED DESCRIPTION

The present disclosure discloses an analog-to-digital conversion (ADC) circuit based on the principle of a stochastic ADC. In the stochastic ADC according to the disclosure the comparator noise is not just tolerated: the proposed architecture leverages the inherent noise present in the comparator circuits to quantize an analog input signal. Whereas most conventional ADC architectures exhibit improved performance in the absence of comparator noise, the performance of the architecture according to this disclosure would degrade significantly without comparator noise, as will be explained below.

Figure 1:
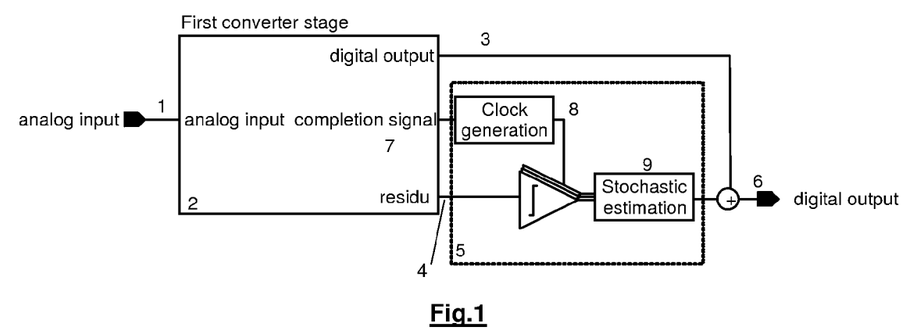
FIG. 1 illustrates a general scheme of an example A/D converter architecture according to the disclosure.

The proposed ADC architecture may comprise two conversion stages in order to increase the effective number of bits (ENOB) and lower the power consumption required for quantizing an analog input signal into its digital equivalent. The proposed architecture may operate in two phases. First there is a conversion stage wherein a rough digital representation of the analog input signal is obtained, as well as an error signal. Next there is a stochastic conversion stage. Then the outcomes of the two stages are combined to produce the digital representation of the applied analog input signal. This example architecture is illustrated in FIG. 1, where an analog input signal (1) is applied to a first conversion stage (2) that produces a digital output (3) roughly representing the input signal and an error signal (4) that subsequently is applied to the stochastic conversion stage (5). The outputs of both stages are then combined to obtain the digitised version (6) of the analog input signal.

The first conversion stage may be, for example, implemented as a Successive Approximation Register (SAR) A/D converter. In this example, a number of cycles of SAR operation generate a digital output word of a certain bit length and a residue voltage which represents the error made in this first conversion stage. The residue is then quantized in the second stochastic conversion stage. Finally, the results from the two phases are added to produce the final output.

The first conversion stage can also be implemented as a pipeline A/D converter. In this example, this first stage then itself includes a number of pipelined stages that each generate a digital output word of a certain bit length and a residue voltage which represents the error made in that stage. The residue voltage of the final pipeline stage can then be quantized in the second stochastic conversion stage. Finally, the digital results of the pipeline stages and the second stochastic stage are added to produce the final output.

In general, the stochastic conversion stage can be applied in any ADC architecture where a small input signal (i.e., a signal of the order of magnitude of the comparator noise) should be quantized with high accuracy at low power.

Figure 2:
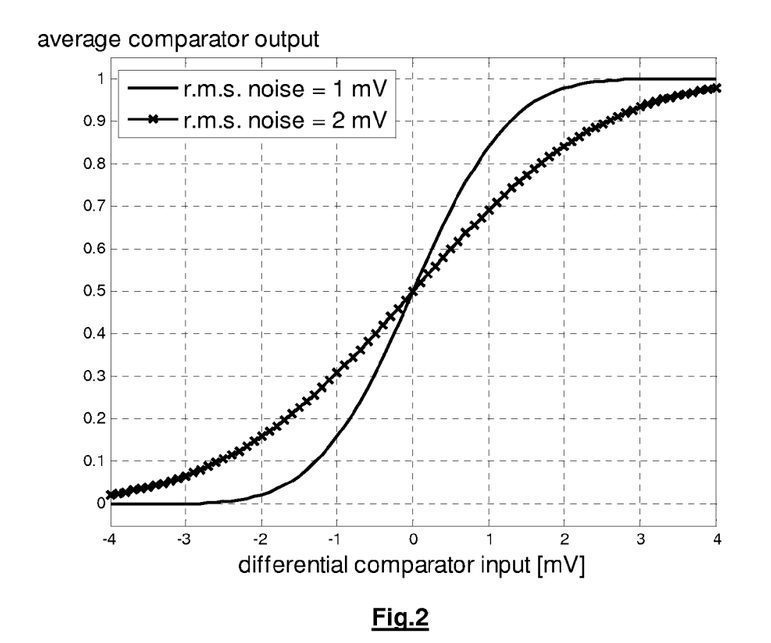
FIG. 2 illustrates the average comparator output as a function of its differential input for two values of r.m.s. comparator noise.

The proposed stochastic stage leverages comparator noise. This comparator noise may be accurately described by an equivalent Gaussian noise source which may be added to the input signal. The sign of the sum of noise and input signal may then determine the comparator output such that the probability of a positive comparator output depends on the input according to an error function, as shown in FIG. 2 for two values of the root mean square (r.m.s.) comparator noise. Due to comparator noise, the comparator can make the wrong decision (i.e., output a zero even when a positive input is applied, or vice versa). As can be seen from FIG. 2, this is more likely when the input was close to the comparator threshold. Since the average of a large number of comparator outputs will converge to the probability corresponding to the applied input, this input can be inferred by calculating the average of a number of comparator decisions. This is the operational principle of a stochastic ADC.

Conventionally, a comparator is designed to resolve a critical comparison in a given ADC, with requirements for decision time and r.m.s. noise derived from the overall ADC requirements for speed and signal-to-noise ratio (SNR). As discussed above, this comparator needs to take decisions at least twice in the prior art solutions, because of the inability to identify a single critical threshold. It is now shown how this factor two overhead can be avoided.

In the present disclosure, an architecture is proposed wherein the single comparator is physically split up in M smaller comparators, each with $\sqrt{M}$ times higher r.m.s. noise but the same total power consumption. If these M low power comparators are then clocked, the average output converges to the probability corresponding to the applied input signal as shown in FIG. 2, provided that M is sufficiently large. This applied input can then be inferred by calculating the average of a number of positive comparator decisions. It can be shown that for a sufficiently high M, the SNR obtained with such an inferred estimate is at least as high as any estimation using the original, M times larger single comparator.

An example advantage of the proposed approach is that by combining the results of the M noisy comparators, the system can estimate not only the sign of the input, as in a conventional comparator, but also the magnitude. Consequently, unlike in a conventional A/D converter, the comparisons do not need to be repeated for different, closely spaced thresholds, thus avoiding the factor two power waste in the power-critical comparison. Note that in the absence of comparator noise, the M comparators return a same result, and no magnitude information can be gained. Comparator noise is therefore important in the operation of the proposed stochastic stage.

Figure 3:
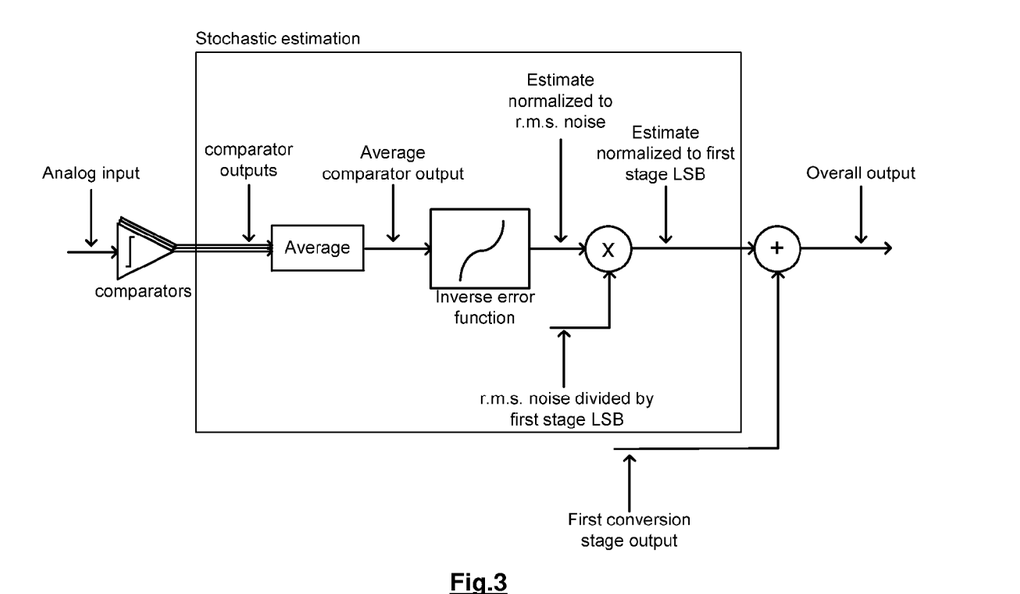
FIG. 3 represents a flowchart showing an example stochastic conversion stage and its addition to first stage output.
Figure 4:
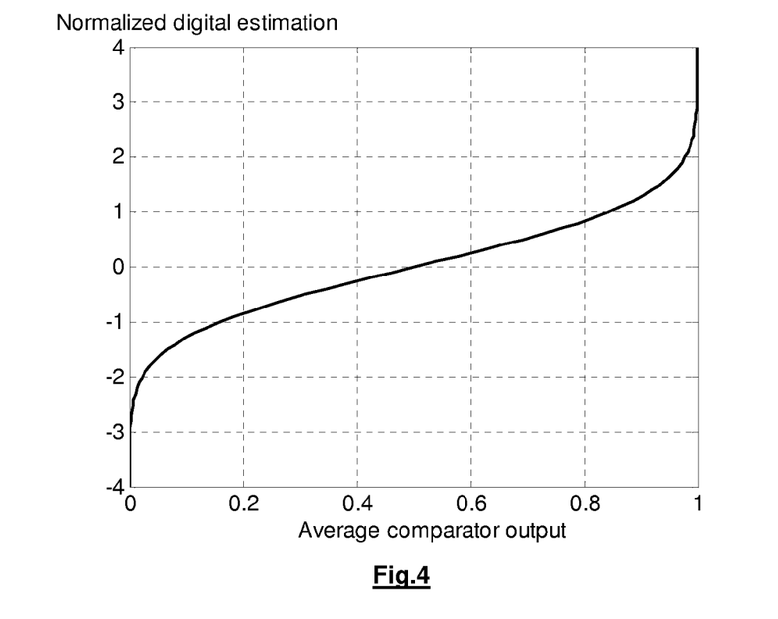
FIG. 4 illustrates an example desired characteristic of the inverse error function block.

The flowchart of FIG. 3 shows an example embodiment of the stochastic phase operation. In this example, first, a set of M comparator decisions is obtained. Due to the inherent comparator noise these comparators decisions display a statistical distribution, whereby the distribution depends on the input signal applied to the comparators. The average decision can be trivially obtained by summing the comparator decisions and dividing by M. The signal thus obtained is the input of a digital block that implements the inverse error function shown in FIG. 4, for example, with a look-up table or a piece-wise linear approximation. The output of this inverse error function is then the digital estimation of the differential input normalized to the r.m.s. comparator noise.

Figure 5:
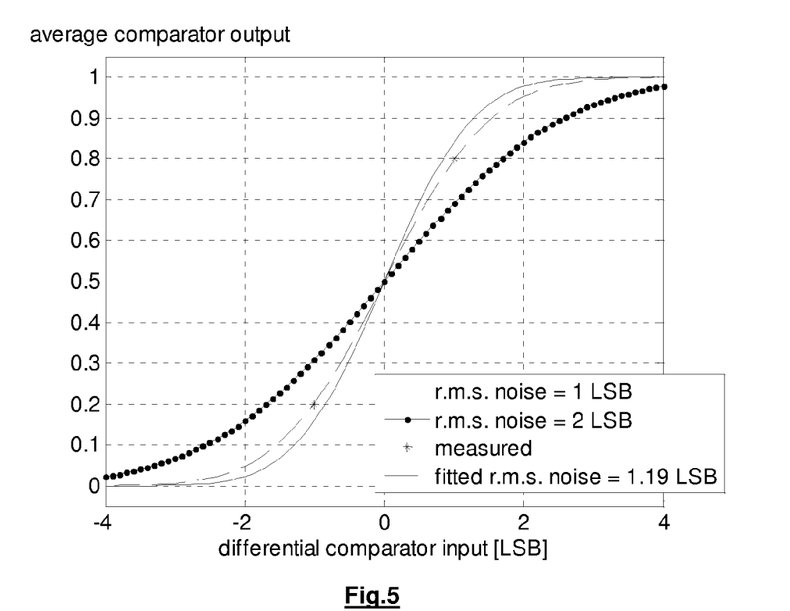
FIG. 5 illustrates an example r.m.s. noise calibration: based on the measurement of two different average comparator outputs at specific inputs, the r.m.s. noise of the comparators can be fitted.

To accurately combine this second stage digital estimation with the digital output of the first stage, the two signals should be added with the correct coefficients. This can be achieved by multiplying the stochastic estimate with a digital signal representing the ratio of the r.m.s. comparator noise to the first stage least significant bit (LSB) and then adding the output of this multiplier to the first stage digital output. In practice the ratio of the r.m.s. comparator noise to the first stage LSB must be measured for example during an offline calibration by observing the average number of positive comparator outputs for two different, well-known inputs of the comparators. In the example of FIG. 5 inputs of −1 LSB and +1 LSB are applied and average outputs of 0.2 and 0.8, respectively, are measured. By fitting of the error function, the r.m.s. noise can then be estimated at 1.19 LSB. This r.m.s. noise measurement step must be repeated only when the comparator noise changes, for example due to a temperature or voltage change.

Figure 6:
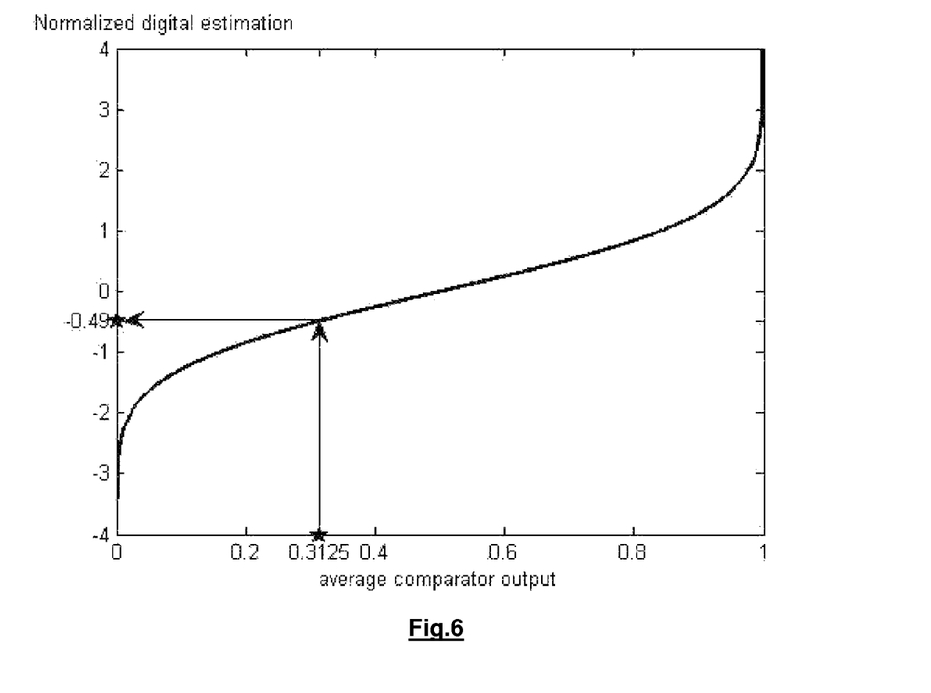
FIG. 6 illustrates an example operation of the stochastic conversion system.

As an additional example, consider a stochastic conversion system with 64 comparisons calibrated using the method above to yield an estimated r.m.s. comparator noise of 1.19 LSB. If an input of −0.43 LSB is applied to this system, 20 of the 64 comparators might return a positive result, for an average output of 0.3125. As shown in FIG. 6, the reverse error function of FIG. 4 can then be used to infer that the input was approximately −0.49 standard deviations. By multiplying this result with the estimated r.m.s. noise, an overall input estimate of −0.583 LSB is obtained. This estimate can then be added to the result of the first stage, reducing the conversion error from 0.43 LSB to 0.153 LSB and thus enhancing the accuracy of the overall ADC at the cost of only the power consumption of 64 noisy comparisons and some simple digital processing. Note that the above numbers serve only to illustrate the operation of an stochastic conversion stage implementation: it should be understood that the effective resolution enhancement in a given ADC may require a more rigorous statistical analysis to calculate.

Figure 7:
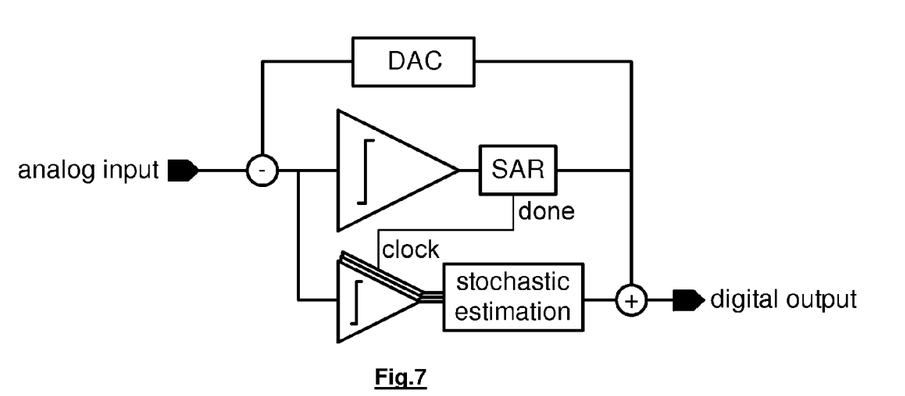
FIG. 7 represents a scheme of an example embodiment of the disclosure with a SAR ADC first converter stage.

Some details of an example implementation with a SAR first stage are discussed now. Reference is made to FIG. 7. In the first stage comparator errors due to noise (as well comparator offset or incomplete settling) change both the digital output and the residue of the first phase. If the residue can be accurately quantized in the second phase these errors are effectively cancelled. As explained below, the second phase can only quantize accurately in a limited range, so the design of the first phase must ensure that the residue falls within this range. This imposes limits on first phase comparator noise, comparator offset and settling time, but these limits are less stringent than in a conventional SAR converter, leading to a lower-power implementation.

Example choices for the stochastic ADC are the number of comparator decisions and their r.m.s. noise. For a constant comparator power in the second phase the number of comparators divided by the r.m.s. noise squared is constant. The effect of this trade-off is illustrated for 16 and 64 comparators with 0.5 mV and 1 mV r.m.s. comparator noise, respectively, in FIG. 8. A larger number of comparators increases the input range in which an accurate estimation with low estimation spread is achieved, at the cost of greater digital complexity.

Figure 8:
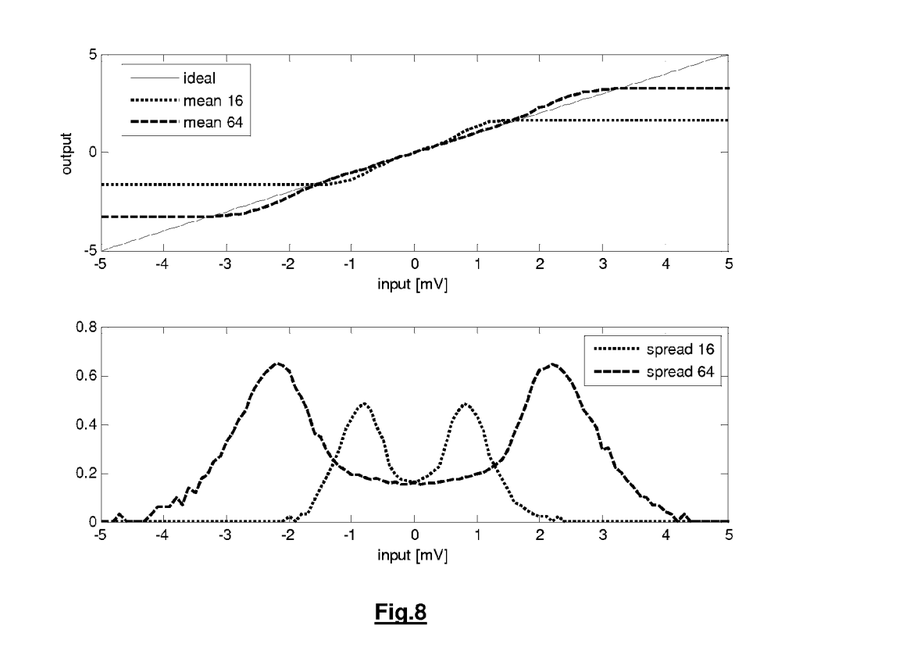
FIG. 8 represents the average output estimation (top) and output estimation spread (bottom) obtained from a simulation with 16 comparators with 0.5 mV and 64 comparators with 1 mV r.m.s. noise.
Figure 9:
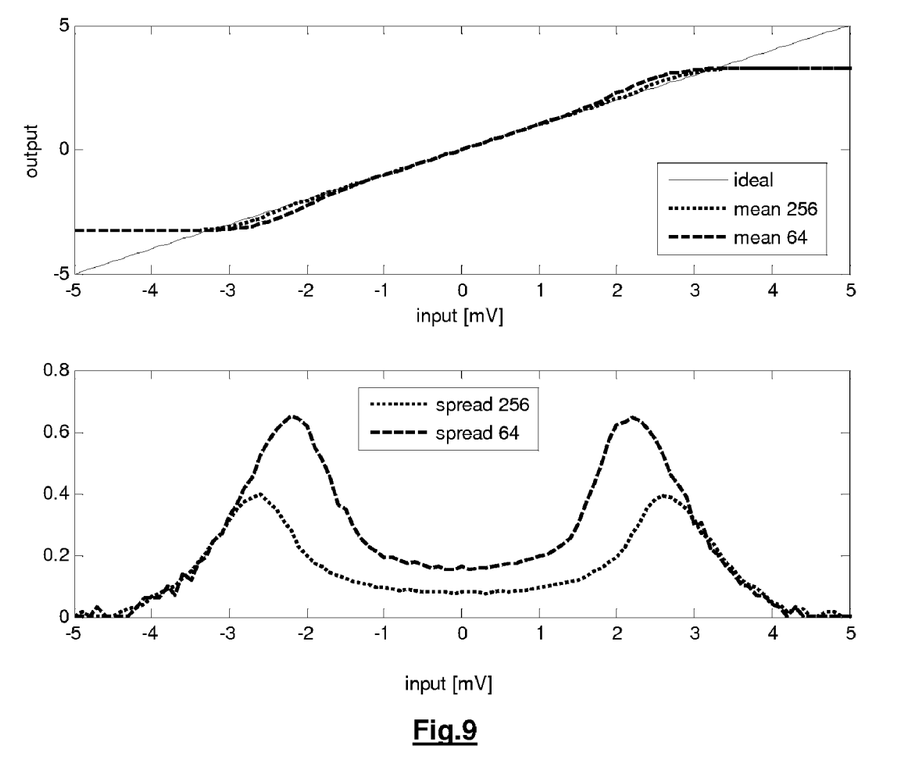
FIG. 9 represents a simulation result of the stochastic ADC with 256 or 64 comparators with 1 mV r.m.s. noise.

It is interesting to note that in FIG. 8 around the comparator threshold the estimation spread is equal for the 16 and 64 comparator scenarios. A way to improve this spread is to increase the power assigned to stochastic comparators. As shown in FIG. 9, the estimation spread can be halved by using 256 instead of 64 comparators of a given noise level at the cost of four times higher comparator power.

In an example, assume 64 comparator decisions with 1 mV r.m.s. noise are chosen. This choice limits the residue range the second phase can reliably quantize as shown in FIG. 8. The first SAR phase may then be designed such that the residue signal does not exceed these limits.

In this example, another architectural choice is how these comparator decisions are obtained: e.g., in series by clocking a single comparator 64 times, in parallel by clocking 64 comparators once, or somewhere between these two extremes. The first option would impose a serious speed penalty but would require the least hardware. The latter option is the fastest, but would require the most hardware, and also adds a significant amount of comparator input capacitance to the system. A compromise between input capacitance, complexity and speed should be found.

Figure 10:
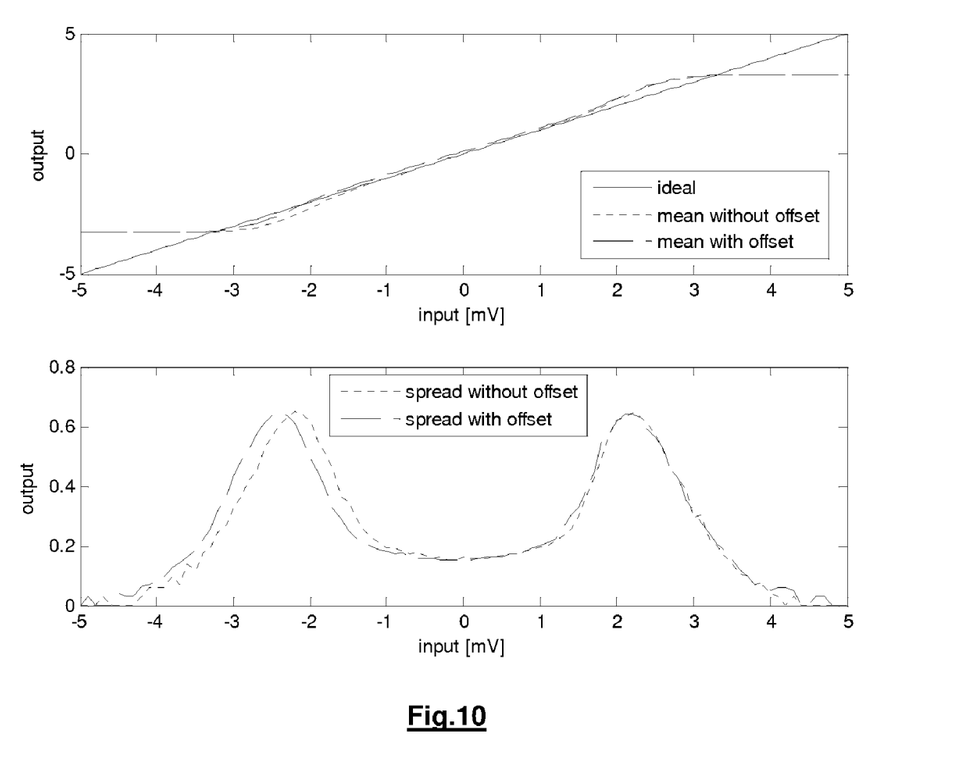
FIG. 10 represents a Monte Carlo simulation result of a stochastic ADC using 64 comparators with 1 mV noise, obtained by clocking 16 comparators 4 times. Scenarios with and without 1 mV of uniformly distributed comparator offset are shown.

The choice of how comparator decisions are obtained also affects the way comparator offset affects the second phase performance. In the "single-comparator" case, comparator offset is added as a fixed offset and not detrimental to performance as long as the useful range of the second phase is respected. If multiple comparators are used their individual offsets are essentially averaged and the overall effect is limited, as long as each comparator is still used in its "noisy" range. FIG. 10 illustrates this for a "typical" instance of 1 mV uniformly distributed comparator offset on 16 comparators. If the offset spread is much larger than the r.m.s. noise spread, the comparator outputs are primarily determined by comparator offset rather than comparator noise. Since in a given technology node comparator offset is typically an order of magnitude larger than r.m.s. noise, it is desirable to artificially reduce offset through calibration in the stochastic stage.

Although the present disclosure has been illustrated by reference to specific embodiments, it will be apparent to those skilled in the art that the disclosure is not limited to the details of the foregoing illustrative embodiments, and that the present disclosure may be embodied with various changes and modifications without departing from the scope thereof. The present embodiments are therefore to be considered in all respects as illustrative and not restrictive, the scope of the disclosure being indicated by the appended claims rather than by the foregoing description, and all changes which come within the meaning and range of equivalency of the claims are therefore intended to be embraced therein. In other words, it is contemplated to cover any and all modifications, variations or equivalents that fall within the scope of the basic underlying principles and whose essential attributes are claimed in this patent application. It will furthermore be understood by the reader of this patent application that the words "comprising" or "comprise" do not exclude other elements or steps, that the words "a" or "an" do not exclude a plurality, and that a single element, such as a computer system, a processor, or another integrated unit may fulfill the functions of several means recited in the claims. Any reference signs in the claims shall not be construed as limiting the respective claims concerned. The terms "first", "second", third", "a", "b", "c", and the like, when used in the description or in the claims are introduced to distinguish between similar elements or steps and are not necessarily describing a sequential or chronological order. Similarly, the terms "top", "bottom", "over", "under", and the like are introduced for descriptive purposes and not necessarily to denote relative positions. It is to be understood that the terms so used are interchangeable under appropriate circumstances and embodiments of the disclosure are capable of operating according to the present disclosure in other sequences, or in orientations different from the one(s) described or illustrated above.

While various aspects and embodiments have been disclosed herein, other aspects and embodiments will be apparent to those skilled in the art. The various aspects and embodiments disclosed herein are for purposes of illustration and are not intended to be limiting, with the true scope and spirit being indicated by the following claims, along with the full scope of equivalents to which such claims are entitled. It is also to be understood that the terminology used herein is for the purpose of describing particular embodiments only, and is not intended to be limiting.

What is claimed is:

1. An analog-to-digital converter circuit arranged for receiving an analog input signal and for outputting a digital representation of said analog input signal, said analog-to-digital converter circuit comprising:
   a first converter stage configured for receiving said analog input signal and for generating a first set of conversion bits, a first completion signal and a residual analog output signal representing a difference between said analog input signal and a signal represented by said first set of conversion bits;
   a second converter stage comprising:
   (i) a clock generation circuit arranged for receiving said first completion signal and for generating a clock signal;
   (ii) a plurality of comparators each being configured for receiving said residual analog output signal and a common reference voltage, said plurality of comparators arranged for being activated by said clock signal and for outputting a plurality of comparator decisions;

(iii) a digital processing stage configured for receiving said plurality of comparator decisions and for generating a second set of conversion bits; and means for generating said digital representation of said analog input signal by combining said first set of conversion bits and said second set of conversion bits.

2. The analog-to-digital converter circuit of claim 1, wherein said second stage further comprises a counter for counting clock pulses and for generating a second completion signal for controlling the number of times said clock signal is generated when the number of clock pulses reaches a given value.

3. The analog-to-digital converter circuit of claim 1, further comprising a digital-to-analog converter circuit configured for generating said signal represented by said first set of conversion bits.

4. The analog-to-digital converter circuit of claim 1, further comprising a subtractor configured for generating said residual analog output signal.

5. The analog-to-digital converter circuit of claim 1, wherein said digital processing stage comprised in said second converter stage is arranged for determining an average value of said plurality of comparator decisions and for determining an input signal level corresponding to said average value.

6. The analog-to-digital converter circuit of claim 1, wherein said first converter stage is implemented as a successive approximation register analog-to-digital converter.

7. The analog-to-digital converter circuit of claim 1, wherein said first converter stage is implemented as a pipeline analog-to-digital converter comprising a plurality of pipelined stages, whereby said residual analog output signal is a residue signal of a last pipelined stage of said plurality.

8. A method for converting an analog input signal into a digital representation of said analog input signal, the method comprising:

performing a first conversion of said analog input signal, thereby generating a first set of conversion bits and a residual analog output signal representing the difference between said analog input signal and a signal represented by said first set of conversion bits;

when a first completion signal is generated, applying said residual analog output signal and a common reference voltage signal to a plurality of comparators, said plurality of comparators being activated by a clock signal, and outputting a plurality of comparator decisions;

processing said plurality of comparator decisions, thereby generating a second set of conversion bits; and generating said digital representation of said analog input signal by combining said first and said second set of conversion bits.

9. The method of claim 8, further comprising performing a calibration for determining an indication of the comparator noise of said plurality of comparators.

10. An analog-to-digital converter circuit arranged for receiving an analog input signal and for outputting a digital representation of said analog input signal, said analog-to-digital converter circuit comprising:

a first converter stage configured for receiving said analog input signal and for generating a first set of conversion bits, a first completion signal and a residual analog output signal representing a difference between said analog input signal and a signal represented by said first set of conversion bits;

a second converter stage comprising:
(i) a clock generation circuit arranged for receiving said first completion signal and for generating a clock signal;
(ii) a plurality of comparators each being configured for receiving said residual analog output signal and a common reference voltage, said plurality of comparators arranged for being activated by said clock signal and for outputting a plurality of comparator decisions;
(iii) a digital processing stage configured for receiving said plurality of comparator decisions and for generating a second set of conversion bits; and an output stage configured for generating said digital representation of said analog input signal by combining said first set of conversion bits and said second set of conversion bits.

* * * * *